United States Patent
Huber et al.

[11] Patent Number: 6,087,853
[45] Date of Patent: Jul. 11, 2000

[54] CONTROLLED OUTPUT IMPEDANCE BUFFER USING CMOS TECHNOLOGY

[75] Inventors: Carol A. Huber, Macungie; Bernard L. Morris, Emmaus; Bijit T. Patel, Breinigsville, all of Pa.

[73] Assignee: Lucent Technologies, Inc., Murray Hill, N.J.

[21] Appl. No.: 09/100,939

[22] Filed: Jun. 22, 1998

[51] Int. Cl.[7] .............................................. H03K 19/0175
[52] U.S. Cl. .................................. 326/83; 326/86; 326/87
[58] Field of Search .................................. 326/30, 31, 32, 326/33, 34, 82, 83, 86, 87, 90

[56] References Cited

U.S. PATENT DOCUMENTS

| | | | |
|---|---|---|---|
| 4,719,369 | 1/1988 | Asano et al. | 307/443 |
| 5,254,883 | 10/1993 | Horowitz et al. | 307/443 |
| 5,334,885 | 8/1994 | Morris . | |
| 5,382,847 | 1/1995 | Yasuda . | |
| 5,457,407 | 10/1995 | Shu et al. . | |
| 5,559,447 | 9/1996 | Rees . | |
| 5,563,539 | 10/1996 | Takase . | |

OTHER PUBLICATIONS

U.S. Ser. application No. 09/083,172 filed May 22, 1998 Gabara et al.

Primary Examiner—Michael Tokar
Assistant Examiner—Ahn Tran
Attorney, Agent, or Firm—Dickstein Shapiro Morin & Oshinsky LLP

[57] ABSTRACT

CMOS technology is used to create a controlled output impedance output buffer circuit. An output buffer driver uses buffer circuits having impedance elements with linear characteristics. A control circuit uses a known impedance load to control the impedance of the buffer circuits. The control circuit monitors a known current flowing through the known impedance load to determine whether the output buffer circuit's output impedance needs to be adjusted to match a transmission line's impedance. Adjustments occur when the control circuit generates control signals to turn on or off various buffer circuits (and their impedance elements) contained within the output driver. In doing so, the output buffer circuit ensures that its output impedance will match the impedance of a transmission line over the entire range of output voltages regardless of the variations caused by the manufacturing process, operation temperature and power supply voltage.

39 Claims, 7 Drawing Sheets

I-V CHARACTERISTICS OF A MOS TRANSISTOR

I-V CHARACTERISTICS OF A RESISTOR

CONTROLLED OUTPUT IMPEDANCE BUFFER USING CMOS TECHNOLOGY

BACKGROUND OF THE INVENTION

1. Field of the Invention

This invention relates generally to output buffer circuits and, more particularly, to a controlled output impedance buffer circuit using complementary metal-oxide semiconductor (CMOS) technology.

2. Description of the Related Art

In integrated circuits, such as, for example, microprocessor and memory circuits, digital signals may be transmitted relatively long distances over transmission lines. A transmission line may be a bus, a printed circuit board trace, or any other similar structure. Typically, a transmission line has a characteristic impedance of 50 to 75 ohms.

Output buffer circuits are used to drive (i.e., send data over) transmission lines. Like transmission lines, output buffer circuits will have an impedance. The impedance of a typical output buffer circuit is dependent upon the components included in the circuit. Problems occur when the output buffer circuit has an impedance that does not match the impedance of the transmission line. For example, the digital signal may be reflected back and forth between the output buffer circuit and the logic at the receiving end (also known as the far end) of the transmission line. These undesirable reflections result in reduced noise immunity and increase the time for the signal to become, and remain, valid at the far end of the transmission line.

FIG. 1. illustrates a prior art technique attempting to remedy impedance mismatches between output buffer circuits 10 and transmission lines. The circuit 10 includes an inverter 12, a NAND gate 14, a NOR gate 16 and two complementary metal-oxide semiconductor (CMOS) transistors 18, 20. It is well known in the art that the amount of current a CMOS transistor 18, 20 can carry is proportional to W/L (where W is the width of the transistor 18, 20 and L is the gate length of the transistor 18, 20). Accordingly, the W/L ratio of a transistor 18, 20 controls the current flowing through it, which also controls its impedance. For example, by decreasing the width of the transistor 18, 20, the current flowing through it will decrease. Accordingly, the impedance of the transistor 18, 20 will go up. Conversely, increasing the width of the transistor 18, 20 increases the current it can carry, which accordingly, decreases its impedance.

The first transistor 18 is a p-channel transistor having its source terminal connected to the power supply voltage $V_{DD}$. The first transistor 18 has its drain terminal connected to node 22 and is used to pull-up the output Z of the circuit 10. The second transistor 20 is an n-channel transistor having its source terminal connected to a nominally ground voltage $V_{SS}$. The second transistor 20 has its drain terminal connected to node 22 and is used to pull-down the output Z of the circuit. The input to the NAND gate 14 is the input signal A and an input enable signal EN. The output P of the NAND gate 14 is connected to the gate of the first transistor 18. The input to the inverter 12 is the input enable signal EN. The output of the inverter 12 is an inverted input enable signal STN. The input to the NOR gate 16 is the input signal A and the inverted input enable signal STN. The output of the NOR gate 16 is connected to the gate of the second transistor 20.

The output Z of the circuit 10 is determined at node 22. When the input enable signal EN is high, the output Z follows the input signal A. That is, if the input signal A is high, the second transistor 20 is off and the first transistor 18 is turned on pulling up the output Z. Accordingly, if the input signal A is low, the first transistor is off and the second transistor 20 is turned on pulling down the output Z. When the input enable signal EN is low, both transistors 18, 20 are off causing the output impedance to be infinite.

Accordingly, if the width of the two transistors 18, 20 are carefully sized, and the manufacturing process, operating temperature and power supply voltage $V_{DD}$ are properly controlled, it is possible that each transistor 18, 20 can have an impedance in the linear region that matches the transmission line's impedance when they are switched on. Unfortunately, CMOS transistors 18, 20 have very non-linear I–V characteristics. Referring now to FIG. 2a, it can be seen that CMOS transistors 18, 20 have a very small linear region 30 and a much larger non-linear region 32.

The slope of these regions 30, 32 represent the conductance (defined as 1/impedance) of the transistors 18, 20. The typical linear region 30 spans only a few tenths of a volt. Therefore, when a drain-to-source voltage on either transistor 18, 20 becomes greater than a few tenths of a volt, the output impedance of the circuit 10 increases dramatically regardless of the width of the transistors 18, 20. In addition, the output impedance will also be altered by any variations in the manufacturing process, operating temperature and power supply voltage $V_{DD}$.

One solution to the problem of non-linearity in the output buffer circuit 10 is to effectively replace the non-linear elements with linear elements. FIG. 3 illustrates an output buffer circuit 40 incorporating two resistors 42, 44 to provide linearity and, therefore, a more stable impedance matching characteristic. Referring now to FIG. 2b, it can be seen that typical resistors 42, 44 have a linear region 34 that spans the entire voltage range. The slope of this region 34 represents the conductance of the resistors 42, 44. Therefore, regardless of the output voltage across the resistors 42, 44, their impedance will not change dramatically as in the case of the transistors 18, 20. Accordingly, the output impedance of the circuit 40 will not change dramatically either, as long as the resistor's impedance is significantly greater than the transistor's impedance.

Referring again to FIG. 3, the first resistor 42 is connected between the drain terminal of the first transistor 18 and node 22. Therefore, the series combination of the first resistor 42 and the first transistor 18 is used to pull-up the output Z. The second resistor 44 is connected between the drain terminal of the second transistor 20 and node 22. Therefore, the series combination of the second resistor 44 and the second transistor 20 is used to pull-down the output Z.

If the two resistors 42, 44 and the width of the two transistors 18, 20 are sized such that each resistor 42, 44 has a much higher impedance than each transistor 18, 20, then the non-linearity problem of circuit 10 (FIG. 1) is overcome. FIG. 4 illustrates the resultant linearity of circuit 40 in comparison to the non-linearity of circuit 10 in relation to the output voltage and resultant impedance of the two circuits 10, 40. The output impedance of the output buffer circuit 10 vs. its output voltage is illustrated by line 50. The output impedance of the output buffer circuit 40 vs. its output voltage is illustrated by line 52. At the two extremes of the output voltage (that is, 0 and 3.3 volts) the output impedance of both circuits is approximately the impedance of the transmission line (in this example, 50 ohms). However, the output impedance of the circuit 10 goes well over 1000 ohms in the mid range of the output voltage, while the impedance of the circuit 40 remains within 10% of 50 ohms through out the entire voltage range. Therefore, due to the linearity of the circuit 40, variations in the output voltage would not dramatically alter the output impedance of the circuit 40.

The impedance of the transistors 18, 20 and the resistors 42, 44, however, can be effected by variations in the manufacturing process. It is known that the manufacturing process will have some known degree of variation. Worst-case slow (WCS), a condition where the impedance is at a maximum (expected impedance plus the known maximum variation), is caused by an increase in impedance of the transistors 18, 20 and resistors 42, 44 during the manufacturing of these parts. Worst-case fast (WCF), a condition where the impedance is at a minimum (expected impedance minus the known maximum variation), is caused by a decrease in impedance of the transistors 18, 20 and resistors 42, 44 during the manufacturing of these parts. WCF, WCS and intermediate impedance conditions are caused by variations in sheet impedance (i.e., impedance of the materials used) which are very difficult to control. In addition, operating temperature and power supply voltage $V_{DD}$ variations will also cause the output impedance of the circuit 40 to mismatch the impedance of the transmission line.

Therefore, although the output buffer circuit 40 is a vast improvement over the circuit 10 illustrated in FIG. 1, there is still a need and desire to properly adjust the output impedance of an output buffer circuit 40 to overcome any of the aforementioned variations.

SUMMARY OF THE INVENTION

This invention provides an output buffer circuit having a controlled output impedance to overcome impedance variations caused by the manufacturing process, operation temperature or power supply voltage.

The above features and advantages are achieved by a controlled output impedance output buffer circuit using CMOS technology. An output buffer driver uses a plurality of buffer circuits containing impedance elements having linear characteristics. A control circuit uses a known impedance load to control the impedance of the buffer circuits. The control circuit monitors a known current flowing through the known impedance load to determine whether the output buffer circuit's output impedance needs to be adjusted to match a transmission line's impedance. Adjustments occur when the control circuit generates control signals to turn on or off various buffer circuits contained within the output buffer driver. In doing so, the output buffer circuit ensures that its output impedance will match the impedance of a transmission line over the entire range of output voltages regardless of the variations caused by the manufacturing process, operation temperature and power supply voltage.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 5:
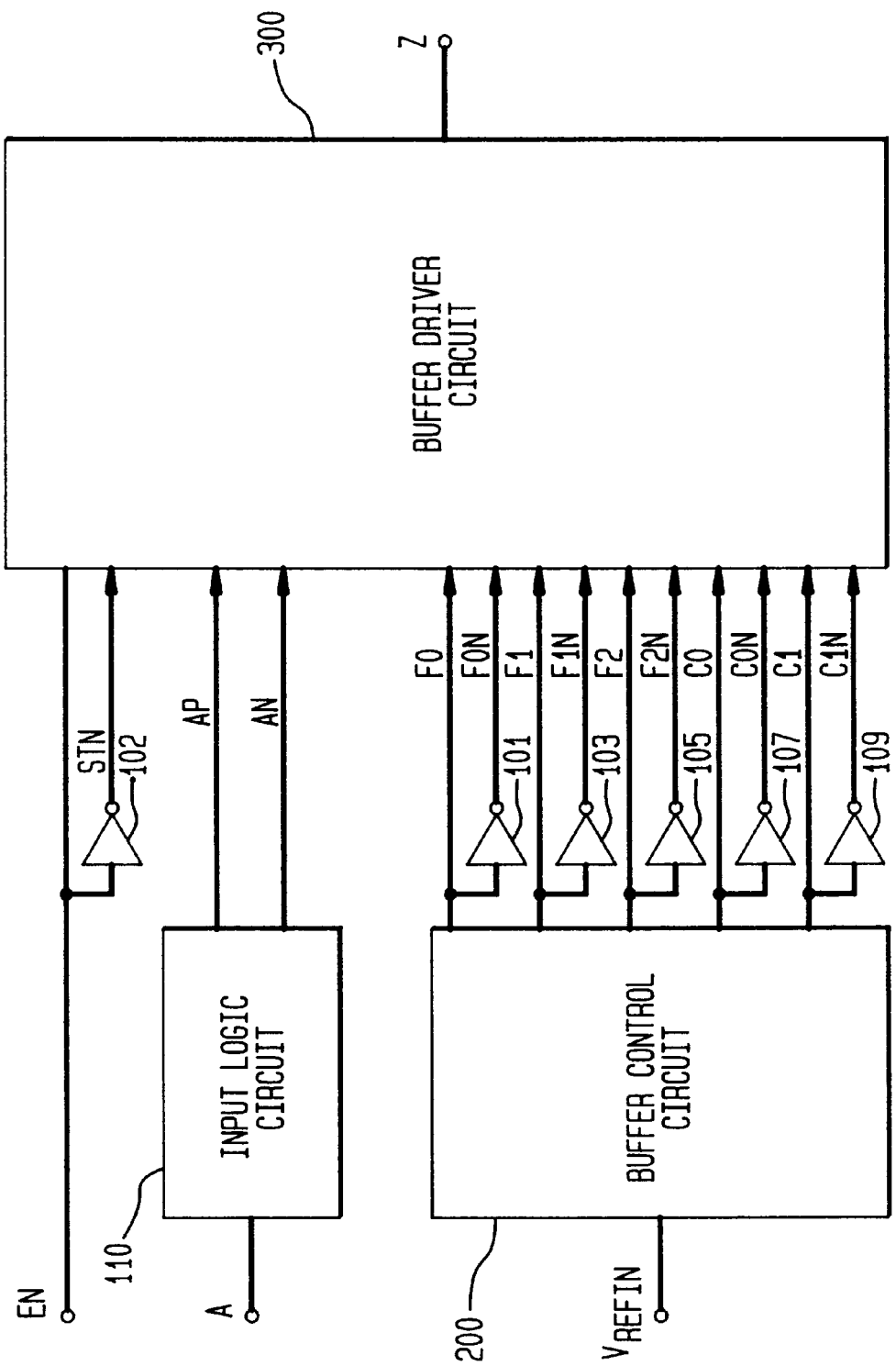
FIG. 5 illustrates a block diagram of a controlled output impedance buffer constructed according to the present invention.

FIG. 5 illustrates a block diagram of a controlled output impedance output buffer circuit 100 constructed in accordance with the present invention. The circuit 100 has a buffer driver circuit 300 that contains a plurality of buffer circuits having impedance elements with linear characteristics. A control circuit 200 that uses a known impedance load to control the impedance of the driver circuit 300. The control circuit 200 monitors a known current flowing through the known impedance load to determine whether the circuit's 100 output impedance needs to be adjusted to match a transmission line's impedance. Adjustments occur when the control circuit 200 generates control signals to turn on or off various buffer circuits (and their associated impedance elements) contained within the buffer driver circuit 300. In doing so, the circuit 100 ensures that its output impedance will match the impedance of a transmission line over the entire range of output voltages regardless of the variations caused by the manufacturing process, operation temperature and power supply voltage $V_{DD}$.

The output buffer circuit 100 includes an input logic circuit 110, a buffer control circuit 200 and a buffer driver circuit 300. Buffer driver circuit 300 is connected to the input enable signal EN and the inverted input enable signal STN. The inverted input enable signal STN is generated by the first inverter 102. Buffer driver circuit 300 is also connected to receive from the input logic circuit 110 an input signal AP and an input signal AN. The generation and use of these input signals AP, AN will be described below in more detail with reference to FIG. 6. Buffer driver circuit 300 is connected to the buffer control circuit 200 by three fine control signals F0, F1, F2, two coarse control signals C0, C1 and their complements F0N, F1N, F2N, C0N, C1N. The generation and use of the signals F0, F1, F2, C0, C1 will be discussed below in more detail with reference to FIGS. 7a and 7b. The five inverters 101, 103, 105, 107, 109 are used to create the signals F0N, F1N, F2N, C0N, C1N. The use of the signals F0N, F1N, F2N, C0N, C1N will also be discussed below in more detail with reference to FIGS. 7–9.

Figure 6:
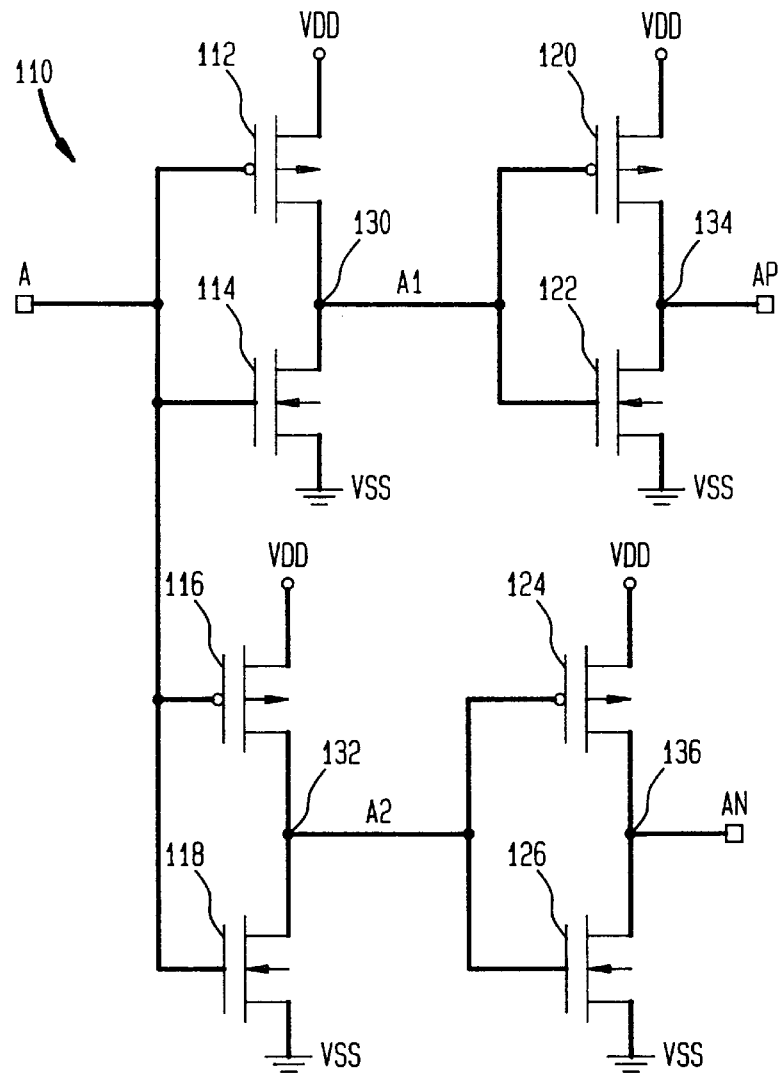
FIG. 6 illustrates an input logic circuit used in the output buffer circuit illustrated in FIG. 5.

FIG. 6 illustrates an exemplary input logic circuit 110 used in the output buffer circuit 100. The circuit 110 generates two non-inverting input signals AP and AN from the input signal A. The generation of these non-inverting input signals AP and AN is required by the buffer driver circuit 300 to ensure that the output impedance of the output buffer circuit 100 will never become infinite during the activation of impedance elements.

The input logic circuit 110 includes four p-channel transistors 112, 116, 120, 124 and four n-channel transistors 114, 118, 122, 126. The first transistor 112 has its source terminal connected to $V_{DD}$ and its drain terminal connected to node 130. The second transistor 114 has its source terminal connected to $V_{SS}$ and its drain terminal connected to the first transistor 112 at node 130. The third transistor 116 has its source terminal connected to $V_{DD}$ and its drain terminal connected to node 132. The fourth transistor 118 has its source terminal connected to $V_{SS}$ and its drain terminal connected to the third transistor 116 at node 132. All four transistors 112, 114, 116, 118 have the input signal A connected to their respective gate terminals.

The fifth transistor 120 has its source terminal connected to $V_{DD}$ and its drain terminal connected to node 134. The sixth transistor 122 has its source terminal connected to $V_{SS}$ and its drain terminal connected to the fifth transistor 120 at node 134. The seventh transistor 124 has its source terminal connected to $V_{DD}$ and its drain terminal connected to node 136. The eight transistor 126 has its source terminal connected to $V_{SS}$ and its drain terminal connected to the seventh transistor 124 at node 136.

The input logic circuit 110 operates as follows. When the input signal A is low, the first and third transistors 112, 116 pull the signal A up and generate high outputs A1 and A2 respectively. The high outputs A1, A2 are then pulled down by the fifth and seventh transistors 120, 124 creating low outputs AP and AN respectively. When the input signal A is high, however, the second and fourth transistors 114, 118 pull the signal A down and generate low outputs A1 and A2 respectively. The low outputs A1, A2 are then pulled up by the sixth and eight transistors 122, 126 creating high outputs AP and AN respectively. Accordingly, the eight transistors 112, 114, 116, 118, 120, 122, 124, 126 form two non-inverting signals AP and AN from the input signal A.

Proper sizing of the eight transistors 112, 114, 116, 118, 120, 122, 124, 126 will ensure that as the input signal A goes low, the signal AP will go low before the signal AN; likewise, as the input signal A goes high, the signal AN will go high before the signal AP. The generation of these non-inverting input signals AP and AN in this manner is required by the buffer driver circuit 300 to ensure that the output impedance of the output buffer circuit 100 will never become infinite during the activation of parallel impedance elements. The use of the signals AP and AN will be discussed below in more detail with reference to FIG. 9.

Figure 7A:
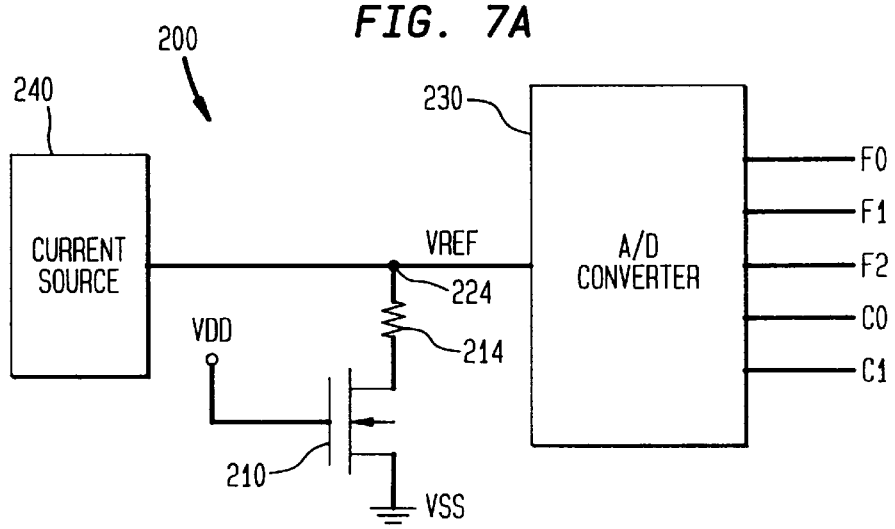
FIGS. 7a and 7b illustrate buffer control circuits used in the output buffer circuit illustrated in FIG. 5.

FIG. 7a illustrates a general implementation of a buffer control circuit 200 used in the output buffer circuit 100. The circuit 200 includes a current source 240 used to generate a predetermined current. This predetermined current flows through a known load (transistor 210 and resistor 214) to generate a reference voltage $V_{REF}$ at node 224. The reference voltage $V_{REF}$ is then used by an analog-to-digital (A/D) converter 230 to generate control signals F0, F1, F2, C0, C1 used to turn on or off various parallel impedance elements (circuits 302, 304, 306, 310, 312) contained within the buffer driver circuit 300.

Figure 7B:
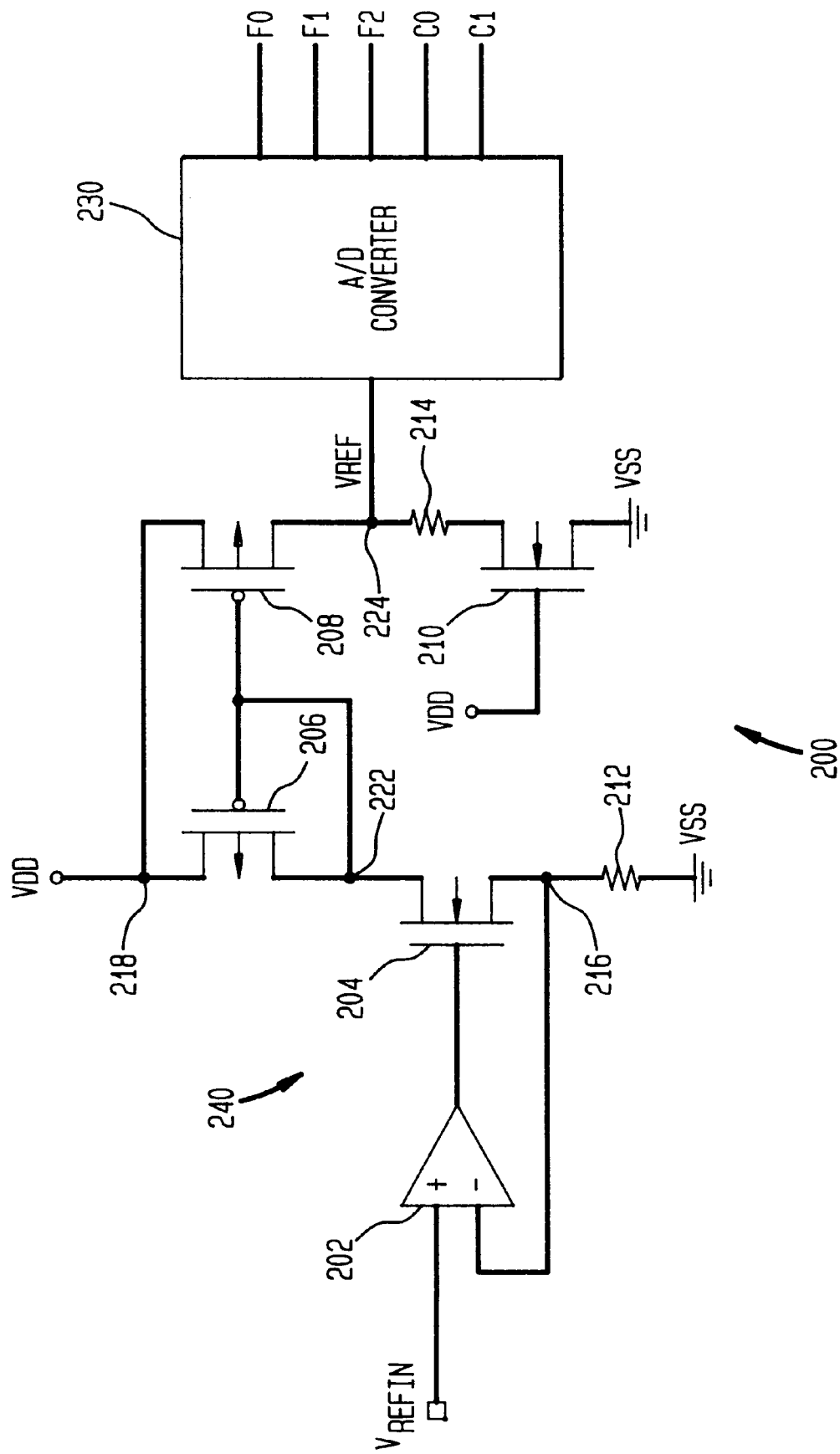

FIG. 7b illustrates one example of a buffer control circuit 200 used in the output buffer circuit 100. The circuit 200 uses a known impedance load 212. The control circuit 200 monitors a known current flowing through the known impedance load to determine whether the circuit's 100 output impedance needs to be adjusted to match a transmission line's impedance. Adjustments occur when the control circuit 200 generates control signals F0, F1, F2, C0, C1 to turn on or off various parallel impedance elements (circuits 302, 304, 306, 310, 312) contained within the buffer driver circuit 300.

The buffer control circuit 200 includes an operational amplifier (op amp) 202, two n-channel transistors 204, 210, two p-channel transistors 206, 208, two resistors 212, 214 and an analog-to-digital (A/D) converter 230. The op amp 202, first transistor 204, first resistor 212, and p-channel transistors 206, 208 defining the current source 240.

The non-inverting terminal of the op amp 202 is connected to an input reference voltage $V_{REFIN}$. The output of the op amp 202 is connected to the gate terminal of the first transistor 204. The source terminal of the first transistor 204 is connected to the first resistor 212 at a node 216. The first resistor 212 is also connected to $V_{SS}$. The inverting terminal of the op amp 202 is also connected to the node 216 forming a feedback loop with the first resistor 212 and the first transistor 204. The drain terminal of the first transistor 204 is connected to the drain terminal of the second transistor 206 at a node 222. The gate terminal of the second transistor 206 is connected to the gate terminal of the third transistor 208 at node 3. The source terminals of the second and third transistors 206, 208 are connected to $V_{DD}$ at node 218. Node 222 is connected such that the current flowing through the first transistor 204 is input to the gates of the second and third transistors 206, 208. The drain terminal of the third transistor 208 is connected to the second resistor 214 at node 224. The second resistor 214 is also connected to the drain terminal of the fourth transistor 210. The gate terminal of the fourth transistor is connected to $V_{DD}$ while the source terminal is connected to $V_{SS}$. The A/D converter 230 is connected to node 224.

The operation of the buffer control circuit 200 is as follows. The aforementioned connection of the op amp 202, the first transistor 204 and the first resistor 212 (having a resistance $R_{212}$)will generate a constant current equal to $V_{REFIN}/R_{212}$ flowing through the first transistor 204 and the first resistor 212. Preferably, the first resistor 212 is a precision resistor to guarantee that the constant current is always very well controlled. It is also preferable that the source of $V_{REFIN}$ also be a precision element for the same reason. This known constant current is mirrored by the second and third transistors 206, 208 such that it flows to the series combination of the second resistor 214 and the fourth transistor 210.

Figure 9:
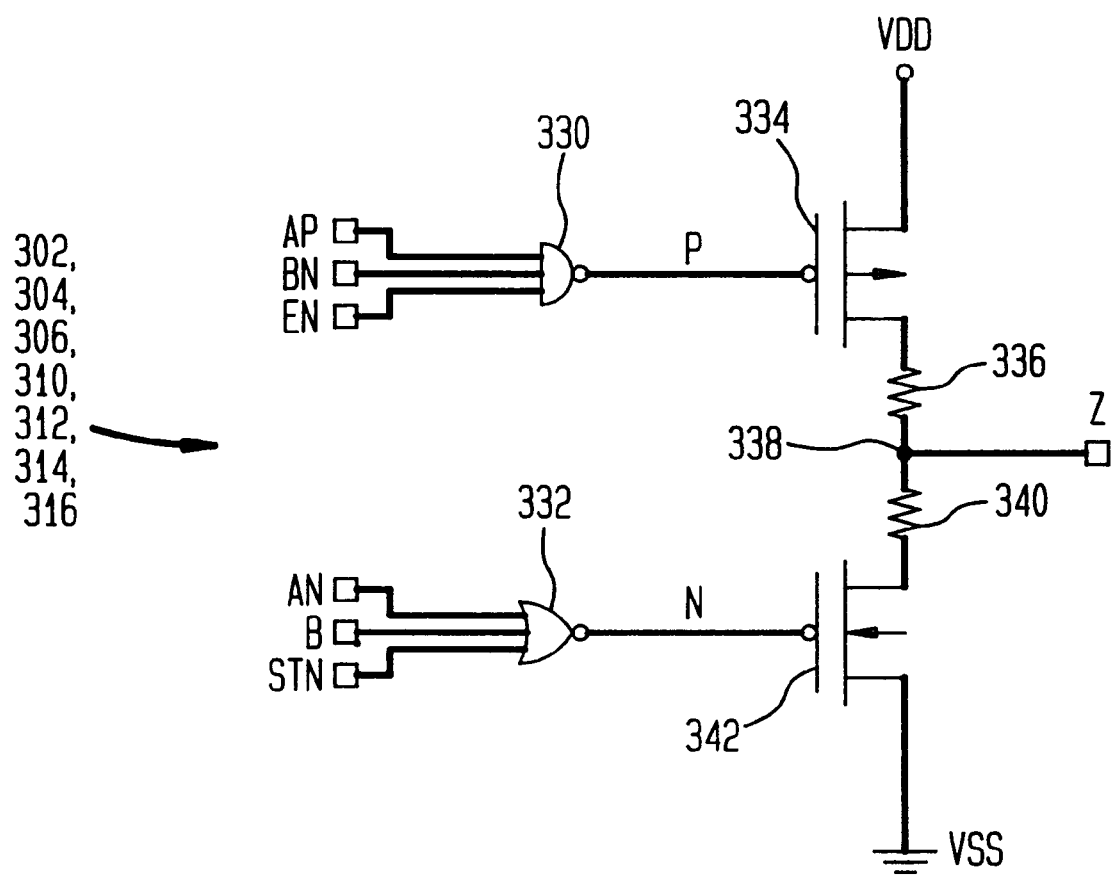
FIG. 9 illustrates a buffer circuit used in the buffer driver circuit illustrated in FIG. 8.

The sizes of the second resistor 214 and the fourth transistor 210 are chosen such that they are the same size of each resistor 336, 340 and transistor 342 in coarse control buffer circuits 310, 312, 314, 316 illustrated in FIG. 9. The reason for this sizing will be described below in more detail. The second resistor 214 and the fourth transistor 210 form a known load (representing the load impedance of one of the coarse buffer circuits 310, 312, 314, 316) in which the known constant current will flow through to generate a reference voltage $V_{REF}$ at node 224. Accordingly, the reference voltage $V_{REF}$ is proportional to the impedance of the second resistor 214 and the fourth transistor 210 (which is also proportional to the impedance of each resistor 336, 340 and transistor 342 in the coarse buffer circuits 310, 312, 314, 316 of FIG. 9). Therefore, any variations in $V_{REF}$, caused by the manufacturing process, etc., would appear in the buffer driver circuit 300 since the known impedance of resistor 210 and transistor 214 matches the impedance of the resistors 336, 340 and transistor 342 of the coarse buffer circuits 310, 312, 314, 316.

The reference voltage $V_{REF}$ is supplied to the A/D converter 230 which outputs control signals F0, F1, F2, C0, C1. The A/D converter 230 will output these signals F0, F1, F2, C0, C1 such that when the load impedance (second resistor 214 and the fourth transistor 210) is at a minimum, i.e., WCF, all of the signals F0, F1, F2, C0, C1 will be high. As will be discussed below in more detail, these signals will disable two of the coarse buffer circuits 310, 312 and all of the fine buffer circuits 302, 304, 306 to make the output impedance of the output buffer circuit 100 match the impedance of the transmission line. Likewise, when the load impedance (second resistor 214 and the fourth transistor 210) is at a maximum, i.e., WCS, all of the signals F0, F1, F2, C0, C1 will be low. These signals will enable two of the coarse buffer circuits 310, 312 and all of the fine buffer circuits 302, 304, 306 to decrease the output impedance of the output buffer circuit 100. For intermediate conditions, the A/D converter 230 will set some signals high and other signal lows depending upon $V_{REF}$. The use of an A/D converter 230 to generate various control signals is described in detail in U.S. Pat. No. 5,334,885 (Morris) which is hereby incorporated by reference in its entirety.

Figure 8:
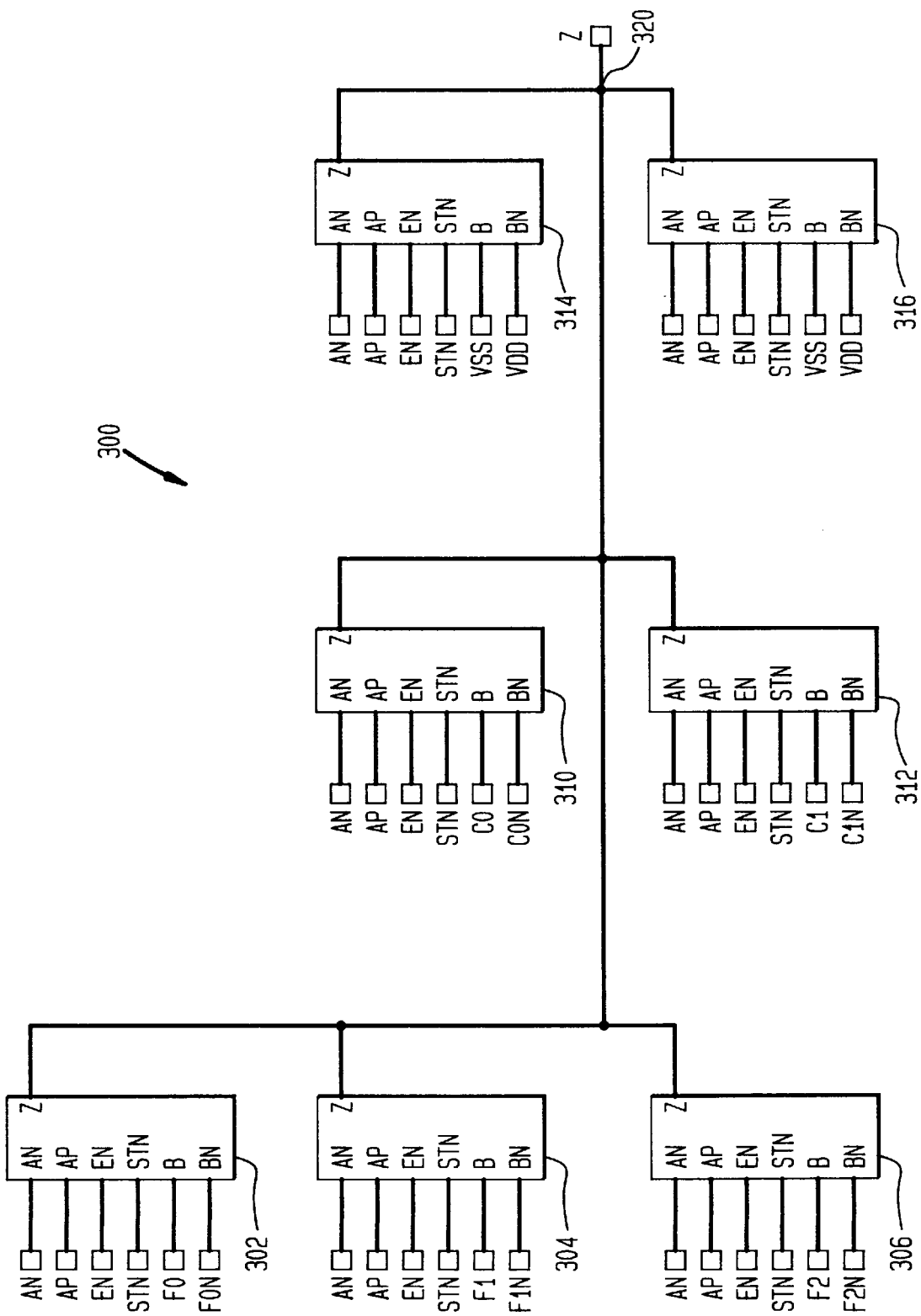
FIG. 8 illustrates a buffer driver circuit used in the output buffer circuit illustrated in FIG. 5.

FIG. 8 illustrates an exemplary buffer driver circuit 300 used in the output buffer circuit 100. The driver circuit 300 contains three fine buffer circuits 302, 304, 306 and four coarse buffer circuits 310, 312, 314, 316. All of the circuits 302, 304, 306, 310, 312, 314, 316 have their outputs z connected in parallel at node 320. As will become apparent, the circuits 302, 304, 306, 310, 312, 314, 316 contain impedance elements having linear characteristics for improved impedance stability. By controlling the combined impedance of these circuits 302, 304, 306, 310, 312, 314, 316, the output impedance of the output buffer circuit 100 can be effectively controlled to always match the impedance of a transmission line regardless of the variations in the impedance of the buffer circuits 302, 304, 306, 310, 312, 314, 316 introduced by the manufacturing process, operation temperature and power supply voltage $V_{DD}$.

The first fine buffer circuit 302 has the first output control signal F0 and its complement F0N for inputs. The second fine buffer circuit 304 has the second output control signal F1 and its complement F1N for inputs. The third fine buffer circuit 306 has the third output control signal F2 and its complement F2N for inputs. The first coarse buffer circuit 310 has the fourth output control signal C0 and its complement C0N for inputs. The second coarse buffer circuit 312 has the fifth output control signal C1 and its complement C1N for inputs. The third and fourth coarse buffer circuits 314, 316 have $V_{DD}$ and $V_{SS}$ for inputs, thus ensuring that they are always on. All of the buffer circuits 302, 304, 306, 310, 312, 314, 316 also have the two input signals AP and AN, the input enable signal EN, and the inverted input enable signal STN for inputs as well.

FIG. 9 illustrates the configuration of the buffer circuits 302, 304, 306, 310, 312, 314, 316. For simplicity reasons only, a discussion of the first fine buffer circuit 302 will be used to explain the configuration and operation of these circuits 302, 304, 306, 310, 312, 314, 316. It must be noted, however, that all of the buffer circuits 302, 304, 306, 310, 312, 314, 316 are constructed as illustrated in FIG. 9 with some minor variations which will become apparent in the following detailed description. The circuit 302 includes a NOR gate 332, a NAND gate 330, a p-channel transistor 334, an n-channel transistor 342 and two resistors 336, 340. The NAND gate 330 has three inputs. The first two are the input signal AP and the input enable signal EN. The third input is a control input, denoted as BN, which is an inverted signal of the output signal F0 from the A/D converter 230. The output P from the NAND gate 330 is connected to the gate terminal of the first transistor 334. The source terminal of the first transistor 334 is connected to $V_{DD}$ while its drain terminal is connected to the first resistor 336. The first resistor is connected to the second resistor 340 at node 338.

The NOR gate 332 has three inputs. The first two are the input signal AN and the inverted input enable signal STN. The third input is a control input, denoted as B, which is the output signal F0 from the A/D converter 230. The output N from the NOR gate 332 is connected to the gate terminal of the second transistor 342. The drain terminal of the second transistor 342 is connected to the second resistor 340 while its source terminal is connected to $V_{SS}$.

The operation of the first fine buffer circuit 302 is as follows. When the control input B (connected to F0) goes high, control input BN (connected to F0N) will go low. As such, the output N of the NOR gate 332 will be low shutting off the second transistor 342 and the output P of the NAND gate 330 will be high shutting off the first transistor 334. With both transistors 334, 342 off, the circuit 302 does not contribute to the output Z of the output buffer circuit 100.

Figure 1:
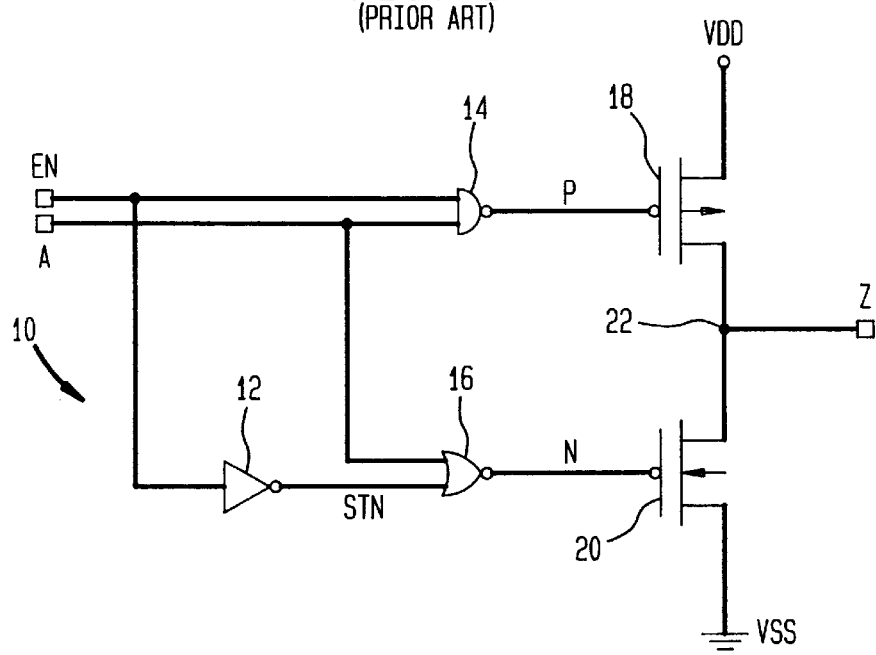
FIG. 1 illustrates a conventional output buffer circuit.
Figure 2A:
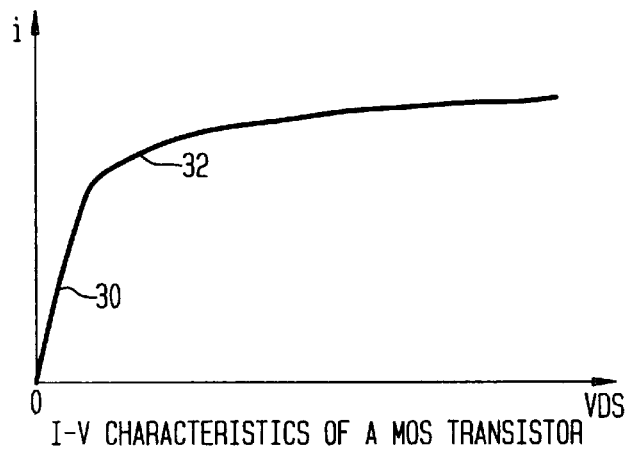
FIGS. 2a and 2b illustrate the I–V characteristics of various CMOS impedance elements.
Figure 2B:
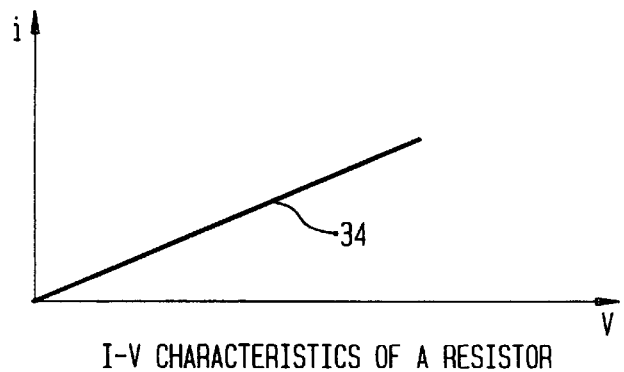
Figure 3:
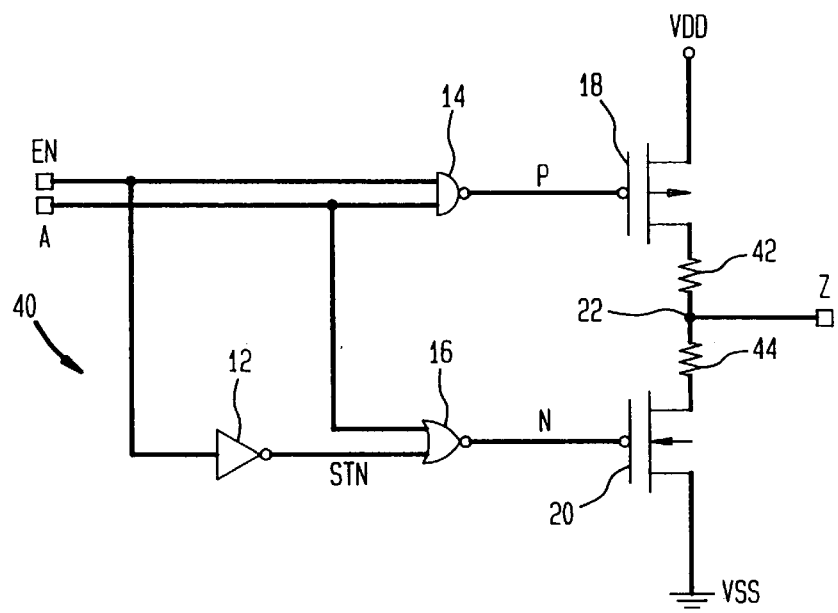
FIG. 3 illustrates another output buffer circuit.
Figure 4:
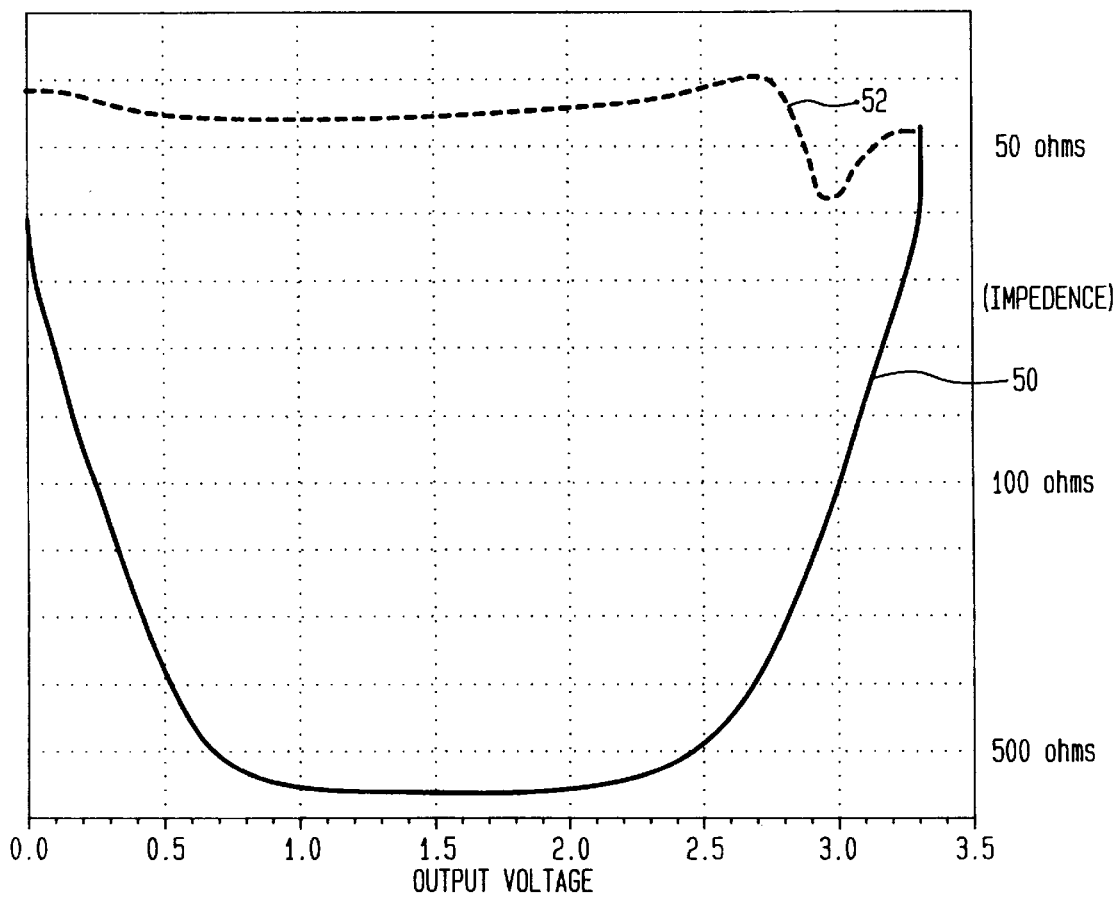
FIG. 4 illustrates the output impedance of the circuits of FIG. 1 and FIG. 3 in comparison to their output voltage.

However, when the control input B (connected to F0) goes low, control input BN (connected to F0N) will go high. With the two control inputs B, BN in this state, the circuit 302 will have an impedance dependent upon the input signals AN and AP, the input enable signal EN and its complement STN (similar to the circuit 10 illustrated in FIG. 1). When the input enable signal EN is high, the circuit's 302 output Z follows the input signals AN and AP. That is, if the input signals AP and AN are high, the second transistor 342 is off and the first transistor 334 is turned on pulling up the output Z. Accordingly, if the input signals AP and AN are low, the first transistor 334 is off and the second transistor 342 is turned on pulling down the output Z. As stated above with reference to FIG. 6, when the input signal A is low, the signal AP will go low before the signal AN; likewise, as the input signal A goes high, the signal AN will go high before the signal AP. By doing so, the impedance of the circuit 302 will not become infinite while switching one transistor 334, 342 on and switching the other transistor 334, 342 off. An infinite impedance during the switching would result in poor output impedance control for the output buffer circuit 100.

The second and third fine buffer circuits 304, 306 and the four coarse buffer circuits 310, 312, 314, 316 all operate in the same manner as circuit 302 with the following exceptions. The second fine buffer circuit 304 has its control input BN connected to output signal F1N and control input B connected to output signal F1. Therefore, the output Z of the circuit 304 is controlled by F1 and F1N. The third fine buffer circuit 306 has its control input BN connected to output signal F2N and control input B connected to output signal F2. Therefore, the output Z of the circuit 306 is controlled by F2 and F2N.

The first coarse buffer circuit 310 has its control input BN connected to output signal C0N and control input B connected to output signal C0. Therefore, the output Z of the circuit 310 is controlled by C0 and C0N. The second coarse buffer circuit 312 has its control input BN connected to output signal C1N and control input B connected to output signal C1. Therefore, the output Z of the circuit 312 is controlled by C1 and C1N. The third and fourth coarse buffer circuits 314, 316 have their control input BN connected to $V_{DD}$ and control input B connected to $V_{SS}$. Therefore, the output Z of these circuits 314, 316 will always contribute to the output impedance of the circuit 100 since BN ($V_{DD}$) will always be high and B ($V_{SS}$) will always be low.

In addition to the control inputs B and BN, there is one other difference between the fine buffer circuits 302, 304, 306 and the coarse buffer circuits 310, 312, 314, 316. The fine buffer circuits 302, 304, 306 when activated will have larger impedances than the coarse buffer circuits 310, 312, 314, 316. Preferably, a fine buffer circuit 302, 304, 306 would have four times the impedance of a coarse buffer circuit 310, 312, 314, 316 although any other multiple is feasible. The two transistors 334, 342 and the two resistors 336, 340 of the seven circuits 302, 304, 306, 310, 312, 314, 316 are sized such that when they are all active and combined in parallel, the output impedance of the output buffer circuit 100 would match a transmission line's impedance when the output buffer circuit 100 is under the WCS condition. The two coarse buffer circuits 314, 316 that are always contributing to the output impedance are sized such that when they are combined in parallel, the output impedance would match the impedance of a transmission line when the output buffer circuit 100 is under the WCF condition. As stated above with reference to FIGS. 7a and 7b, the buffer control circuit 200 generates control signals F0, F1, F2, C0, C1 responsive to variations in the manufacturing process to adjust the output impedance of the output buffer circuit 100. These signals F0, F1, F2, C0, C1 and their complements F0N, F1N, F2N, C0N, C1N are used to add or remove the impedances of the circuits 302, 304, 306, 310, 312 to control the output impedance of the output buffer circuit 100. Accordingly, the output buffer circuit 100 contains an output impedance capable of being adjusted by fine and coarse controls. With this type of control mechanism, and the fact that the impedance elements of the buffer driver circuit 300 have linear characteristics, the output buffer circuit 100 has a much improved controlled output impedance over existing output buffer circuits.

It must be noted that the above description is just one of many possible configurations for the output buffer circuit 100. For example, there can be any number of fine and coarse buffer circuits 302, 304, 306, 310, 312, 314, 316. Accordingly, there can be any number of control output signals from the A/D converter 230. The differences in the impedances of these circuits 302, 304, 306, 310, 312, 314, 316 can also vary and are not to be limited to the 1/4 ratio described above with reference to FIG. 9. In addition, the known impedance load of the control circuit 200 can match the impedance of the fine buffer circuits 302, 304, 306. Most importantly, the controlled output impedance output buffer circuit 100 can be sized to match any impedance of any transmission line and is not to be limited to the use with 50 ohm transmission lines.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An output buffer circuit comprising:
   a control circuit including a reference impedance, said control circuit generating output signals in accordance with variations in said reference impedance, said control circuit comprising:
      a current source for generating a predefined current,
      a first impedance element connected to said current source to receive said predefined current,
      a first control element connected between said first impedance element and a terminal for a first voltage such that said output voltage is generated by said predefined current, and
      an analog-to-digital converter connected to said output voltage for generating said output signals; and
   a transmission line driver circuit containing an output impedance, said driver circuit changing said output impedance in accordance with said output signals.

2. The circuit according to claim 1 wherein said control circuit generates said output signals responsive to changes in electrical properties of said reference impedance which represent changes in said output impedance.

3. The circuit according to claim 1 wherein said driver circuit includes a plurality of buffer circuits, each having a respective output impedance element, the output impedance elements of said plurality of buffer circuits being selectively connected together to form said output impedance in response to said output signals.

4. The circuit according to claim 3 wherein said plurality of buffer circuits are configured into coarse output impedance buffer circuits and fine output impedance buffer circuits.

5. The circuit according to claim 4 wherein said fine output impedance buffer circuits have an output impedance that is at least four times an output impedance of said coarse output impedance buffer circuits.

6. The circuit according to claim 1 wherein said output impedance and said reference impedance have linear impedance characteristics.

7. The circuit according to claim 1 wherein said first control element is a transistor.

8. The circuit according to claim 1 wherein said first impedance element is a resistor.

9. The circuit according to claim 1 wherein said current source comprises:
   a transistor;
   a second impedance element connected between a drain terminal of said transistor and a second voltage; and
   an operational amplifier having a first input connected to a reference voltage and a second input connected to a connection of said transistor and said second impedance element, said operational amplifier having an output connected to a gate terminal of said transistor such that said predefined current flows through said transistor and said second impedance element.

10. The circuit according to claim 9 wherein said second impedance element is a resistor.

11. The circuit according to claim 3 further comprising:
   an input logic circuit connected to an input signal and generating at least two input logic output signals, said driver circuit being connected to said input logic output signals, said input logic output signals ensuring that said output impedance does not become infinite when the output impedance elements of said buffer circuits are being activated or deactivated in response to said output signals.

12. The circuit according to claim 11 wherein said input logic circuit comprises a pair of non-inverting logic circuits, said pair of non-inverting logic circuits generating said two input logic output signals such that said two input logic output signals change logic levels at different times.

13. The circuit according to claim 1 wherein said driver circuit includes a plurality of buffer circuits, each of said plurality of buffer circuits comprising:
   a NAND gate having an input that includes at least an input signal and a complement of an output signal from said driver circuit, said NAND gate having an output;
   a first resistor;
   a second resistor connected to said first resistor in series;
   a first transistor being activated by said NAND gate output, said first transistor connected between said first resistor and a voltage, wherein upon activation, said first transistor pulls-up the output of said buffer circuit;
   a NOR gate having an input that includes at least an input signal and the output signal input into said NAND gate, said NOR gate having an output; and a second transistor being activated by said NOR gate output, said second transistor being connected between said second resistor and a second voltage, wherein upon activation, said second transistor pulls-down the output of said buffer circuit.

14. An integrated circuit comprising:
a control circuit including a reference impedance, said control circuit generating output signals in accordance with variations in said reference impedance, said control circuit comprises:
  a current source having a predefined current,
  a first impedance element connected to receive said predefined current,
  a first control element connected between said first impedance element and a first voltage such that said output voltage is generated by said predefined current, and
  an analog-to-digital converter connected to said output voltage for generating said output signals; and
a transmission line driver circuit containing an output impedance, said driver circuit changing said output impedance in accordance with said output signals.

15. The circuit according to claim 14, wherein said control circuit generates said output signals responsive to changes in electrical properties of said reference impedance which represent changes in said output impedance.

16. The circuit according to claim 14 wherein said driver circuit includes a plurality of buffer circuits, each having a respective output impedance element, the output impedance elements of said plurality of buffer circuits being selectively connected together to form said output impedance in response to said output signals.

17. The circuit according to claim 16 wherein said plurality of buffer circuits are configured into coarse output impedance buffer circuits and fine output impedance buffer circuits.

18. The circuit according to claim 17 wherein said fine output impedance buffer circuits have an output impedance that is at least four times an output impedance of said coarse output impedance buffer circuits.

19. The circuit according to claim 14 wherein said output impedance and said reference impedance load have linear impedance characteristics.

20. The circuit according to claim 14 wherein said first control element is a transistor.

21. The circuit according to claim 20 wherein said first impedance element is a resistor.

22. The circuit according to claim 14 wherein said current source comprises:
  a transistor;
  a second impedance element connected between a drain terminal of said transistor and a second voltage; and
  an operational amplifier having a first input connected to a reference voltage and a second input connected to a connection of said transistor and said second impedance element, said operational amplifier having an output connected to a gate terminal of said transistor such that said predefined current flows through said transistor and said second impedance element.

23. The circuit according to claim 22 wherein said second impedance element is a resistor.

24. The circuit according to claim 16 further comprising:
an input logic circuit connected to an input signal and generating at least two input logic output signals, said driver circuit being connected to said input logic output signals, said input logic output signals ensuring that said output impedance does not become infinite when the output impedance elements of said buffer circuits are being activated or deactivated in response to said output signals.

25. The circuit according to claim 24 wherein said input logic circuit comprises a pair of non-inverting logic circuits, said pair of non-inverting logic circuits generating said two input logic output signals such that said two input logic output signals change logic levels at different times.

26. The circuit according to claim 14 wherein said driver circuit includes a plurality of buffer circuits, each of said plurality of buffer circuits comprising:
  a NAND gate having an input that includes at least an input signal and a complement of an output signal from said driver circuit, said NAND gate having an output;
  a first resistor;
  a second resistor connected to said first resistor in series;
  a first transistor being activated by said NAND gate output, said first transistor connected between said first resistor and a voltage, wherein upon activation, said first transistor pulls-up the output of said buffer circuit;
  a NOR gate having an input that includes at least an input signal and the output signal input into said NAND gate, said NOR gate having an output; and
  a second transistor being activated by said NOR gate output, said second transistor being connected between said second resistor and a second voltage, wherein upon activation, said second transistor pulls-down the output of said buffer circuit.

27. A method of manufacturing an output buffer circuit on a semiconductor device comprising the steps of:
providing a control circuit including a reference impedance on the semiconductor device, said control circuit generating output signals in accordance with variations in said reference impedance, said control circuit being provided by:
  providing a current source having a predefined current,
  providing a first impedance element,
  connecting said first impedance element to said predefined current,
  providing a first control element,
  connecting said first control element between said first impedance element and a first voltage such that said output voltage is generated by said predefined current,
  providing an analog-to-digital converter, and
  connecting said analog to digital converter to said output voltage for generating said output signals; and
providing a transmission driver circuit which contains an output impedance and which changes said output impedance in accordance with said output signals.

28. The method according to claim 27 wherein the step of providing said current source comprises:
providing a second transistor;
providing a second impedance element;
connecting said second impedance element between a drain terminal of said second transistor and a second voltage;
providing an operational amplifier;
connecting a first input of said operational amplifier to a reference voltage and a second input to a connection of said second transistor and said second impedance element; and
connecting an output of said operational amplifier to a gate terminal of said second transistor such that said predefined current flows through said second transistor and said second impedance element.

29. The method according to claim 27 wherein the step of providing said driver circuit comprises:

providing a plurality of buffer circuits, each having a respective output impedance elements, the output impedance elements of said plurality of buffer circuits are selectively connected together to form said output impedance in response to said output signals.

30. The method according to claim 29 wherein the step of providing a plurality of buffer circuits comprises:

providing a NAND gate having an input connected to at least an input signal and a complement of an output signal from said control circuit, said NAND gate having an output;

providing a first resistor;

providing a second resistor connected to said first resistor in series;

providing a first transistor being connected to and activated by said NAND gate output, said first transistor connected between said first resistor and a first voltage, wherein upon activation, said first transistor pulls-up the output of said buffer circuit;

providing a NOR gate having an input connected to least said input signal and the output signal connected to said NAND gate, said NOR gate having an output;

providing a second transistor being connected to and activated by said NOR gate output, said second transistor being connected between said second resistor and a second voltage, wherein upon activation, said second transistor pulls-down the output of said buffer circuit.

31. The method according to claim 29 further comprising:

providing an input logic circuit connected to an input signal and generating at least two input logic output signals;

connecting the output impedance elements of said buffer circuits to said input logic output signals, wherein said output signals ensures that the output impedance does not become infinite when the output impedance elements of said buffer circuit are being activated or deactivated in response to said output signals.

32. The method according to claim 31 wherein the step of providing said input logic circuit comprises:

providing a pair of non-inverting logic circuits, said pair of non-inverting logic circuits generating said two input logic output signals such that said two output signals change logic levels at a different times.

33. A method of controlling an output impedance of an integrated circuit comprising the steps of:

providing a reference impedance;

generating output signals in accordance with variations in said reference impedance;

providing a transmission line driver circuit having an output impedance, said driver circuit including a plurality of buffer circuits, each having a respective output impedance element;

selectively connecting together the output impedance elements of said plurality of driver circuits to form said output impedance in response to said output signals; and ensuring that said output impedance does not become infinite when the output impedance elements of said buffer circuits are being selectively connected.

34. The method according to claim 33 wherein the step of ensuring that said output impedance does not become infinite comprises:

providing an input logic circuit connected to an input signal;

generating at least two input logic output signals such that said two input logic output signals change logic values at a different time; and connecting said driver circuit to said input logic output signals to ensure that said output impedance does not become infinite.

35. An output buffer circuit comprising:

a control circuit including a reference impedance, said control circuit generating output signals in accordance with variations in said reference impedance; and a transmission line driver circuit containing an output impedance, said driver circuit changing said output impedance in accordance with said output signals, said driver circuit including a plurality of buffer circuits, each of said plurality of buffer circuits comprising:

a NAND gate having an input that includes at least an input signal and a complement of an output signal from said driver circuit, said NAND gate having an output, a first resistor, a second resistor connected to said first resistor in series, a first transistor being activated by said NAND gate output, said first transistor connected between said first resistor and a voltage, wherein upon activation, said first transistor pulls-up the output of said buffer circuit, a NOR gate having an input that includes at least an input signal and the output signal input into said NAND gate, said NOR gate having an output, and a second transistor being activated by said NOR gate output, said second transistor being connected between said second resistor and a second voltage, wherein upon activation, said second transistor pulls-down the output of said buffer circuit.

36. An output buffer circuit comprising:

a control circuit including a reference impedance, said control circuit generating output signals in accordance with variations in said reference impedance;

a transmission line driver circuit containing an output impedance, said driver circuit changing said output impedance in accordance with said output signals, said driver circuit including a plurality of buffer circuits, each having a respective output impedance element, the output impedance elements of said plurality of buffer circuits being selectively connected together to form said output impedance in response to said output signals; and an input logic circuit connected to an input signal and generating at least two input logic output signals, said driver circuit being connected to said input logic output signals, said input logic output signals ensuring that said output impedance does not become infinite when the output impedance elements of said buffer circuits are being activated or deactivated in response to said output signals.

37. An integrated circuit comprising:

a control circuit including a reference impedance, said control circuit generating output signals in accordance with variations in said reference impedance; and a transmission line driver circuit containing an output impedance, said driver circuit changing said output impedance in accordance with said output signals, said driver circuit includes a plurality of buffer circuits, each of said plurality of buffer circuits comprising:

a NAND gate having an input that includes at least an input signal and a complement of an output signal from said driver circuit, said NAND gate having an output, a first resistor, a second resistor connected to said first resistor in series, a first transistor being activated by said NAND gate output, said first transistor connected between said first resistor and a voltage, wherein upon activation, said first transistor pulls-up the output of said buffer circuit, a NOR gate having an input that includes at least an input signal and the output signal input into said NAND gate, said NOR gate having an output, and a second transistor being activated by said NOR gate output, said second transistor being connected between said second resistor and a second voltage, wherein upon activation, said second transistor pulls-down the output of said buffer circuit.

38. An integrated circuit comprising:

a control circuit including a reference impedance, said control circuit generating output signals in accordance with variations in said reference impedance; and a transmission line driver circuit containing an output impedance, said driver circuit changing said output impedance in accordance with said output signals, said driver circuit including a plurality of buffer circuits, each having a respective output impedance element, the output impedance elements of said plurality of buffer circuits being selectively connected together to form said output impedance in response to said output signals; and an input logic circuit connected to an input signal and generating at least two input logic output signals, said driver circuit being connected to said input logic output signals, said input logic output signals ensuring that said output impedance does not become infinite when the output impedance elements of said buffer circuits are being activated or deactivated in response to said output signals.

39. An integrated circuit comprising:

a control circuit including a reference impedance, said control circuit generating output signals in accordance with variations in said reference impedance, said control circuit comprising:

a current source for generating a predefined current, a first impedance element connected to said current source to receive said predefined current, a first control element connected between said first impedance element and a terminal for a first voltage such that said output voltage is generated by said predefined current, and an analog-to-digital converter connected to said output voltage for generating said output signals; and a transmission line driver circuit containing an output impedance, said driver circuit changing said output impedance in accordance with said output signals.

* * * * *